(12) United States Patent
Khare et al.

(10) Patent No.: US 8,193,099 B1
(45) Date of Patent: Jun. 5, 2012

(54) PROTECTING EXPOSED METAL GATE STRUCTURES FROM ETCHING PROCESSES IN INTEGRATED CIRCUIT MANUFACTURING

(75) Inventors: Mukesh V. Khare, White Plains, NY (US); Renee T. Mo, Briarcliff Manor, NY (US); Ravikumar Ramachandran, Pleasantville, NY (US); Richard S. Wise, Newburgh, NY (US); Hongwen Yan, Somers, NY (US)

(73) Assignee: International Business Machines Corporation, Armonk, NC (US)

( * ) Notice: Subject to any disclaimer, the term of this patent is extended or adjusted under 35 U.S.C. 154(b) by 0 days.

(21) Appl. No.: 13/049,933

(22) Filed: Mar. 17, 2011

(51) Int. Cl.
*H01L 21/302* (2006.01)
*H01L 21/461* (2006.01)

(52) U.S. Cl. ........... 438/710; 257/E21.017; 257/E21.02; 257/E21.218; 257/E21.219; 257/E21.222; 257/E21.245; 257/E21.309; 438/306; 438/689; 438/706; 438/707

(58) Field of Classification Search ........... 257/E21.017, 257/E21.02, E21.218, E21.219, E21.222, 257/E21.245; 256/E21.309; 438/366, 689, 438/706, 707, 710
See application file for complete search history.

(56) References Cited

U.S. PATENT DOCUMENTS

| | | | |
|---|---|---|---|
| 5,650,343 A | 7/1997 | Luning et al. | |
| 6,297,104 B1 | 10/2001 | Tyagi et al. | |
| 6,744,083 B2 | 6/2004 | Chen et al. | |
| 7,579,282 B2 | 8/2009 | Rauf et al. | |
| 7,585,735 B2 | 9/2009 | Mathew et al. | |
| 2007/0166973 A1* | 7/2007 | Rauf et al. | 438/592 |
| 2008/0057635 A1 | 3/2008 | Chen | |
| 2009/0098737 A1 | 4/2009 | Doris et al. | |
| 2010/0109056 A1 | 5/2010 | Pal et al. | |

OTHER PUBLICATIONS

M. M. Hussain et al., "Metal Wet Etch Issues and Effects In Dual Metal Gate Stack Integration," J. Electrochem. Soc., vol. 153, 2006, pp. G389-G393.
S. A. Vitale et al., "High Density Plasma Etching of Titanium Nitride Metal Gate Electrodes for Fully Depleted Silicon-on-insulator Sub-threshold Transistor Integration," J. Vac. Sci. Technol. B, vol. 27, 2009, pp. 2472-2479.

* cited by examiner

*Primary Examiner* — Asok Sarkar
(74) *Attorney, Agent, or Firm* — Cantor Colburn LLP; Ian MacKinnon

(57) ABSTRACT

A method of forming a semiconductor device includes forming a transistor gate stack over a substrate having an active area and a shallow trench isolation (STI) region. First sidewall spacers are formed on the transistor gate stack, and an isotropic etch process is applied to isotropically remove an excess portion of a metal layer included within the transistor gate stack, the excess portion left unprotected by the first sidewall spacers. Second sidewall spacers are formed on the transistor gate stack, the second sidewall spacers completely encapsulating the metal layer of the transistor gate stack.

20 Claims, 12 Drawing Sheets

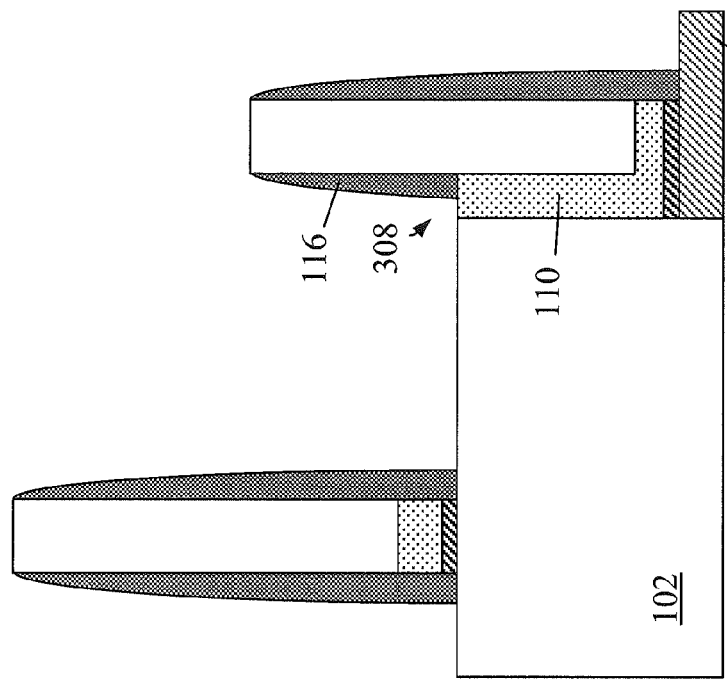
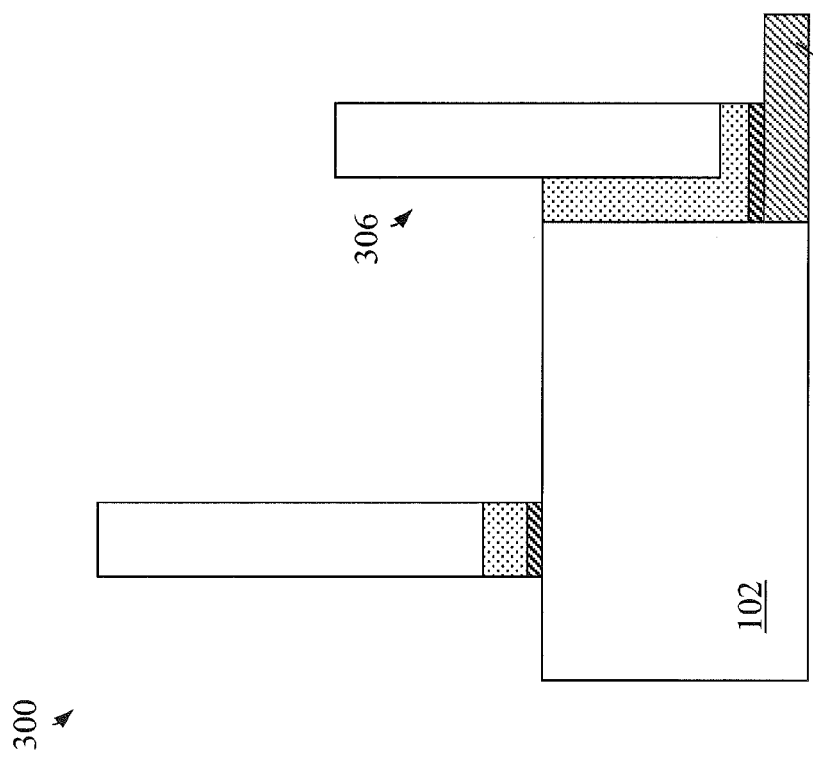
Figure 3(a) (prior art)
Figure 3(b) (prior art)

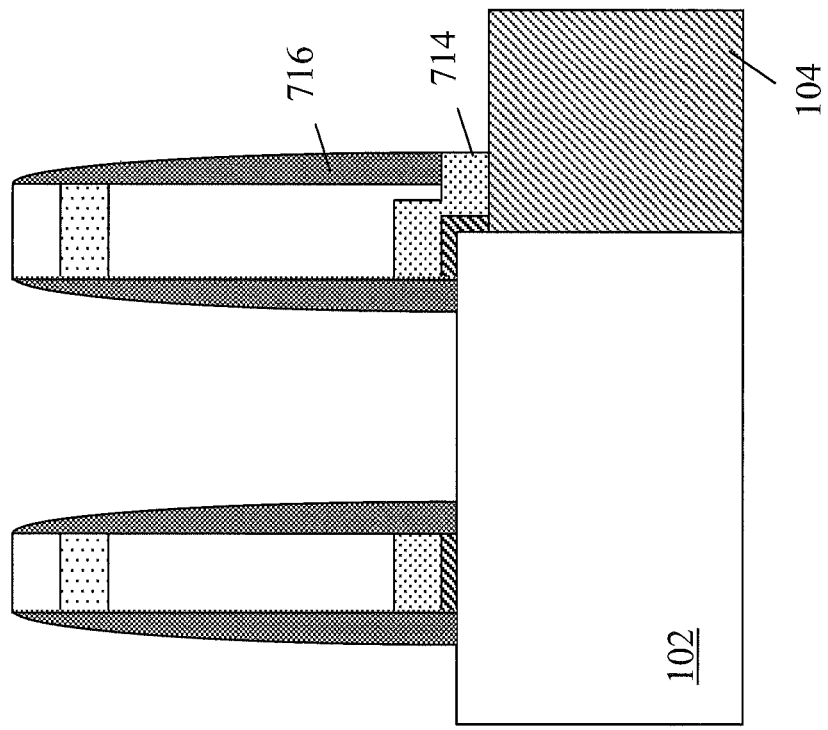
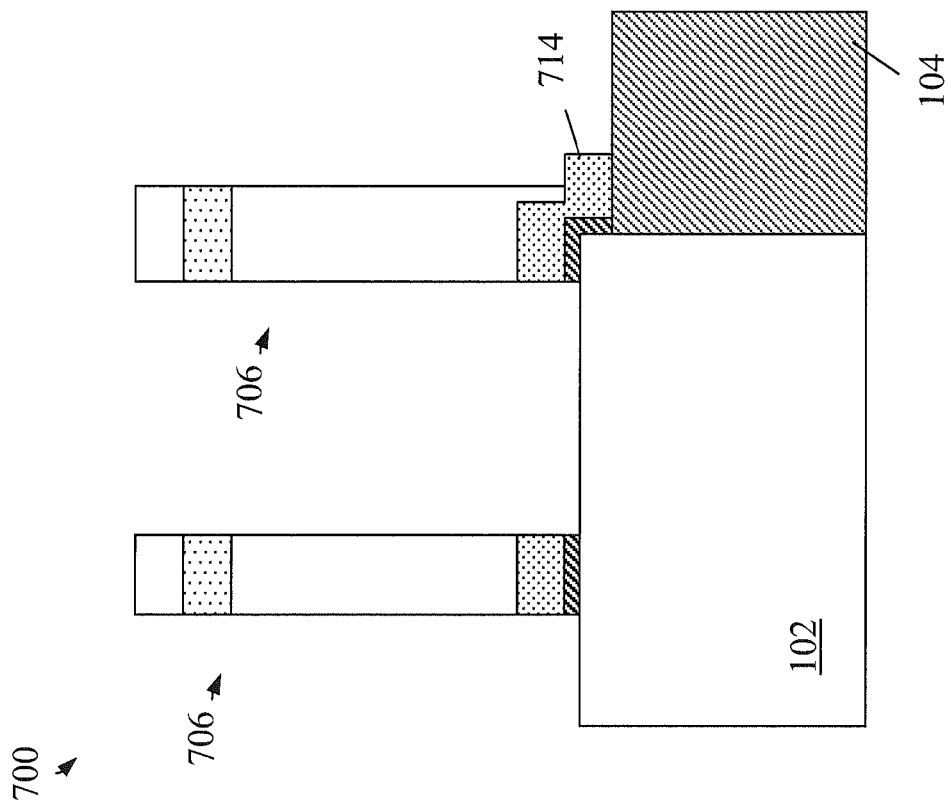
Figure 7(a)
Figure 7(b)

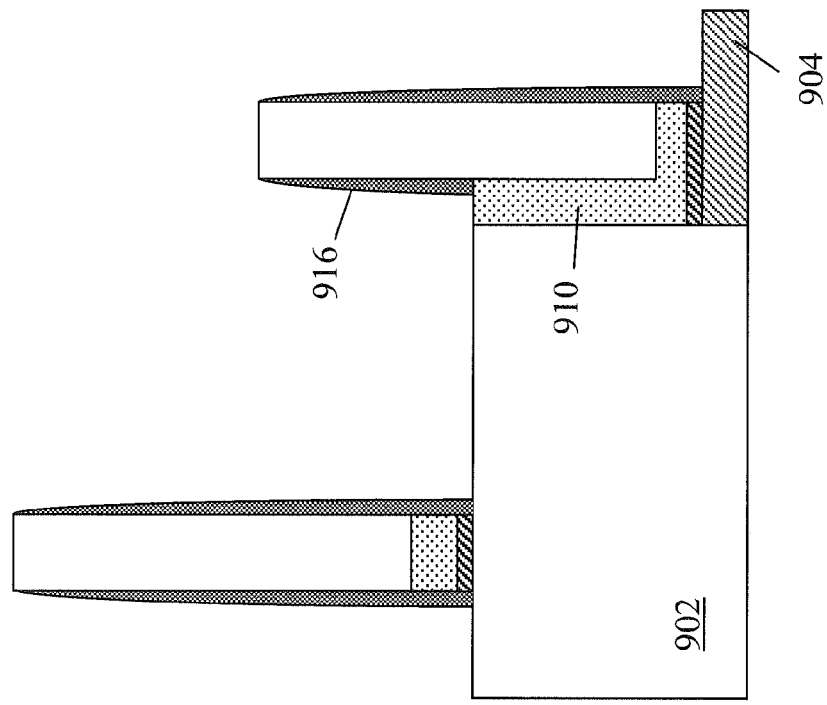
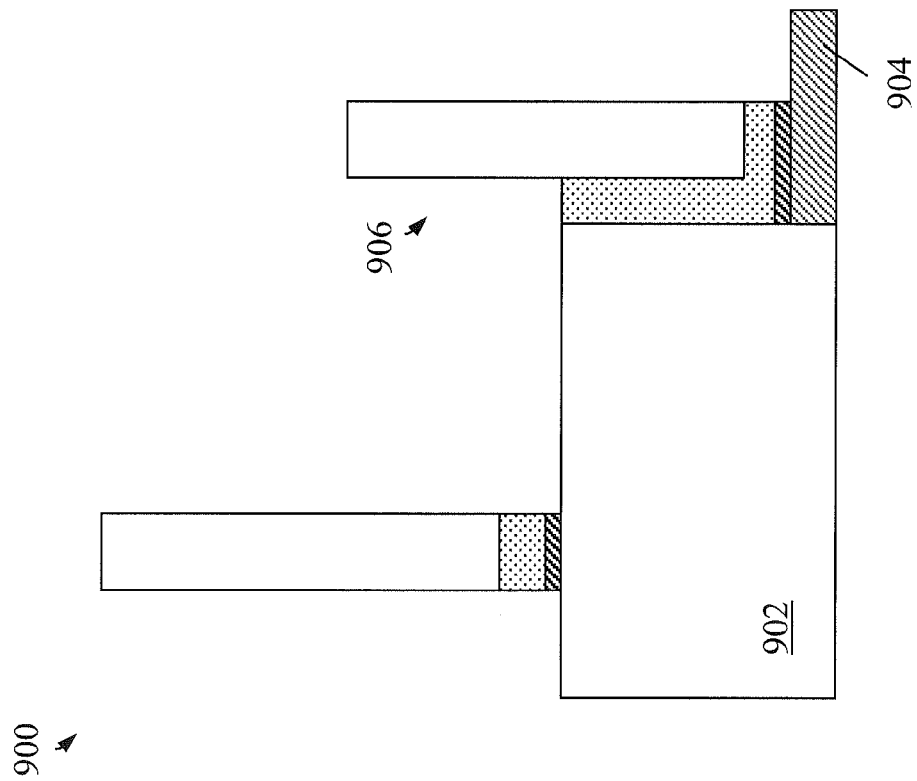
Figure 9(b)
Figure 9(a)

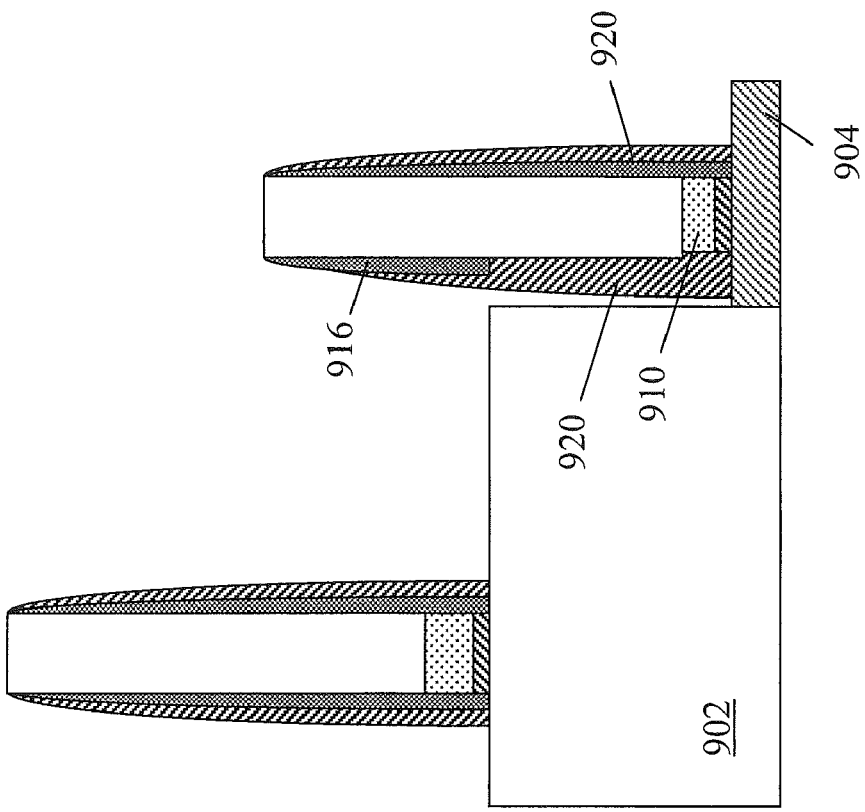
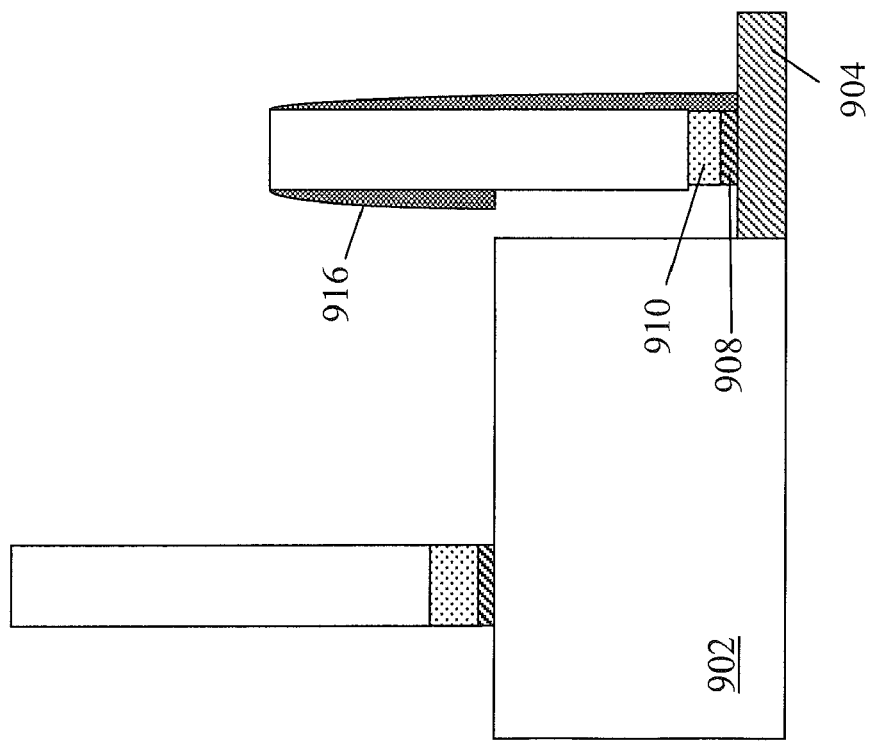
Figure 9(d)
Figure 9(c)

US 8,193,099 B1

PROTECTING EXPOSED METAL GATE STRUCTURES FROM ETCHING PROCESSES IN INTEGRATED CIRCUIT MANUFACTURING

BACKGROUND

The present invention relates generally to semiconductor device manufacturing and, more particularly, to methods of protecting exposed metal gate structures from etching processes during integrated circuit manufacturing.

In standard complementary metal oxide semiconductor (CMOS) devices, polysilicon is typically used as the gate material. The technology of fabricating CMOS devices using polysilicon gates has been in a constant state of development, and is now widely used in the semiconductor industry. One advantage of using polysilicon gates is that they can sustain high temperatures. However, there are also some problems associated with using a polysilicon gate. For example, due to the poly-depletion effect, polysilicon gates commonly used in CMOS devices are becoming a gating factor in chip performance for channel lengths of 0.1 micron and below. Another problem with polysilicon gates is that the dopant material in the polysilicon gate (e.g., boron) can easily diffuse through the thin gate dielectric, causing further degradation of the device performance.

Thus, one proposed way of improving the performance of sub-micron transistors is to use metal gate stacks (e.g., polysilicon over metal) in place of conventional polysilicon gates, particularly with the advent of high dielectric constant (high-k) gate dielectric materials such as, for example, hafnium dioxide ($HfO_2$), hafnium silicon oxynitride (HfSiON), and zirconium dioxide ($ZrO_2$). The metal gate electrode portions of the gate stack are configured with an appropriate work function, and may include materials such as, for example, lanthanum (La), aluminum (Al), magnesium (Mg), ruthenium (Ru), titanium-based materials such as titanium (Ti) and titanium nitride (TiN), tantalum-based materials such as tantalum (Ta) and tantalum nitride (TaN) or tantalum carbide (TaC).

During the fabrication of an integrated circuit device, structures such field effect transistor (FET) gate stacks are exposed to various etchant and cleaning chemistries. To protect the gate stack, particularly a gate stack comprising sensitive materials such as high-k dielectrics and metal gate-forming materials, a silicon nitride spacer is formed adjacent sidewalls of the gate stack. However, depending on non-uniformities of the gate stack fabrication process or non-uniformities created during preparation of the semiconductor substrate prior to fabrication of the gate stacks, a silicon nitride spacer may not be adequate to protect the high-k metal gate (HKMG) stack.

For example, prior to fabrication of the gate stacks, shallow trench isolation (STI) regions are formed within a semiconductor substrate to electrically isolate other regions of the semiconductor substrate. Typically, the STI regions are fabricated by etching regions of the substrate (exposed by a patterned hardmask over the substrate) to form trenches therein, and depositing an insulating material such as silicon oxide in the trenches. The deposited oxide is then planarized, followed by removal of the hardmask used in creating the STI pattern. In order to remove the hardmask, a wet etch chemistry is applied, which can result in the slight lateral etching of the STI oxide material. This lateral etching in turn causes a divot or void to be formed at the edge of the STI region bordering the active semiconductor region.

Where a gate stack layer is formed at the border of the active and STI regions (i.e., over a divot or step height in topography), portions of the metal gate material may be left unprotected by sidewall spacers and thus susceptible to wet etch chemistries during subsequent middle-of-line (MOL) processing operations. Such etching can create a void within the gate stack and thus device failure and gate lift-off. In addition to STI divots, metal gate footings can also result in gate structures formed on a planar surface, such as dummy gates formed on STI regions that are adjacent an active area where a step height is present. Footings can also result from various non-uniformities in reactive ion etching processes, photolithography processes used to form the gate stacks, and the like.

SUMMARY

In an exemplary embodiment, a method of forming a semiconductor device includes forming a transistor gate stack over a substrate having an active area and a shallow trench isolation (STI) region; forming first sidewall spacers on the transistor gate stack; applying an isotropic etch process to isotropically remove an excess portion of a metal layer included within the transistor gate stack, the excess portion left unprotected by the first sidewall spacers; and forming second sidewall spacers on the transistor gate stack, the second sidewall spacers completely encapsulating the metal layer of the transistor gate stack.

In another embodiment, a method of forming a transistor device, includes forming a transistor gate stack over a substrate having an active area and a shallow trench isolation (STI) region, the transistor gate stack comprising a high-K dielectric layer, a metal layer over the high-K dielectric layer, and a polysilicon layer over the metal gate layer; forming first sidewall spacers on the transistor gate stack; applying an isotropic etch process to isotropically remove an excess portion of the metal layer gate, the excess portion left unprotected by the first sidewall spacers; and forming second sidewall spacers on the transistor gate stack, the second sidewall spacers completely encapsulating the metal layer of the transistor gate stack.

BRIEF DESCRIPTION OF THE SEVERAL VIEWS OF THE DRAWINGS

Referring to the exemplary drawings wherein like elements are numbered alike in the several Figures:

FIG. 3(a) is a cross-sectional view of a semiconductor device structure with HKMG stacks where a dummy gate formed on an STI region adjacent an active area is formed with excess metal thickness at the STI/active area border;

FIG. 3(b) illustrates the formation of sidewall spacers on the HKMG stacks of FIG. 3(a), illustrating exposure of the excess metal thickness to subsequent etching;

FIGS. 7(a) through 7(e) are a sequence of cross-sectional views illustrating a method of protecting exposed metal gate structures from etching processes during integrated circuit manufacturing, in accordance with an exemplary embodiment, in which:

FIG. 7(a) illustrates a semiconductor device structure with HKMG stacks where an active area gate formed adjacent an STI region partially extends over to the STI region, leading to formation of a metal foot on the STI region;

FIG. 7(b) illustrates the formation of a first set of spacers over the HKMG stacks of FIG. 7(a);

FIG. 7(c) illustrates isotropic etching of the structure of FIG. 7(b) to undercut the exposed metal in the stack;

FIG. 7(d) illustrates removal of the first set of spacers; and

FIG. 7(e) illustrates formation a second set of spacers over the HKMG stacks to protect the metal;

FIGS. 8(a) through 8(d) are a sequence of cross-sectional views illustrating a method of protecting exposed metal gate structures from etching processes during integrated circuit manufacturing, in accordance with an exemplary embodiment, in which:

FIG. 8(a) illustrates a semiconductor device structure with HKMG stacks where an active area gate formed adjacent an STI region partially extends over to the STI region, leading to formation of a metal foot on the STI region;

FIG. 8(b) illustrates the formation of a first set of spacers over the HKMG stacks of FIG. 8(a);

FIG. 8(c) illustrates isotropic etching of the structure of FIG. 8(b) to remove the exposed metal foot in the stack; and FIG. 8(d) illustrates formation a second set of spacers over the first set of spacers and HKMG stacks to protect the metal;

FIGS. 9(a) through 9(d) are a sequence of cross-sectional views illustrating a method of protecting exposed metal gate structures from etching processes during integrated circuit manufacturing, in accordance with another exemplary embodiment, in which:

FIG. 9(a) illustrates a semiconductor device structure with HKMG stacks where a dummy gate formed on an STI region adjacent an active area is formed with excess metal thickness at the STI/active area border;

FIG. 9(b) illustrates the formation of a first set of spacers over the HKMG stacks of FIG. 9(a);

FIG. 9(c) illustrates isotropic etching of the structure of FIG. 9(b) to undercut the exposed metal in the stack; and FIG. 9(d) illustrates formation a second set of spacers over first set of spacers and the HKMG stacks to protect the metal.

DETAILED DESCRIPTION

Figures 1A, 1B:
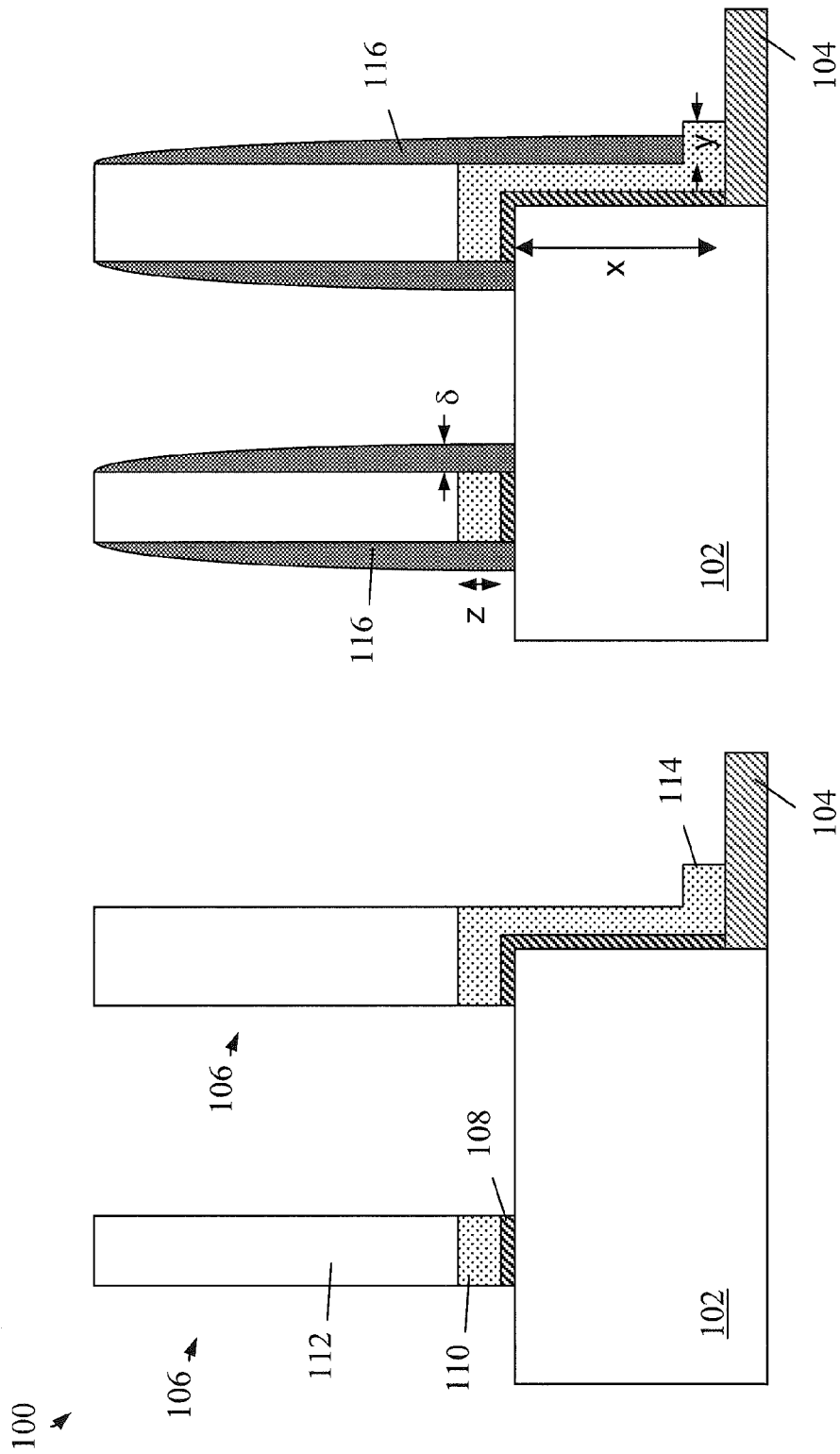
FIG. 1(a) is a cross-sectional view of a semiconductor device structure with HKMG stacks where an active area gate formed adjacent an STI region partially extends over to the STI region, leading to formation of a metal foot on the STI region.
FIG. 1(b) illustrates the formation of sidewall spacers on the HKMG stacks of FIG. 1(a), illustrating exposure of the excess metal thickness to subsequent etching.

Referring initially to FIG. 1(a), there is shown a cross-sectional view of a semiconductor device structure 100, in which an active device area 102 is adjacent an STI region 104. A substrate corresponding to the active device area 102 may include any suitable semiconducting material such as, but not limited to: silicon (Si), germanium (Ge), silicon germanium (SiGe), silicon carbide (SiC), silicon germanium carbide (SiGeC), gallium arsenide (GaAs), gallium nitride (GaN), indium arsenide (InAs), indium phosphide (InP) and all other III/V or II/VI compound semiconductors. The semiconductor substrate may also comprise an organic semiconductor or a layered semiconductor such as Si/SiGe, a silicon-on-insulator (SOI), a SiGe-on-insulator (SGOI) or germanium-on-insulator (GOI).

As further shown in FIG. 1(a), a plurality of HKMG stacks 106 are formed over the active area, and include a high-K dielectric layer 108 (e.g., hafnium silicate, zirconium silicate, hafnium dioxide, zirconium dioxide, etc.) one or metal layers 110 (e.g., titanium nitride (TiN)) formed over the high-K dielectric layer 108, and a polysilicon layer 112 formed over the metal layer(s) 110. In this instance, it will be noted that the active area gate stack 106 located adjacent the STI region 104 partially extends over to the STI region 104, thus leading to formation of a metal foot 114 on the STI region 104.

Figure 2:
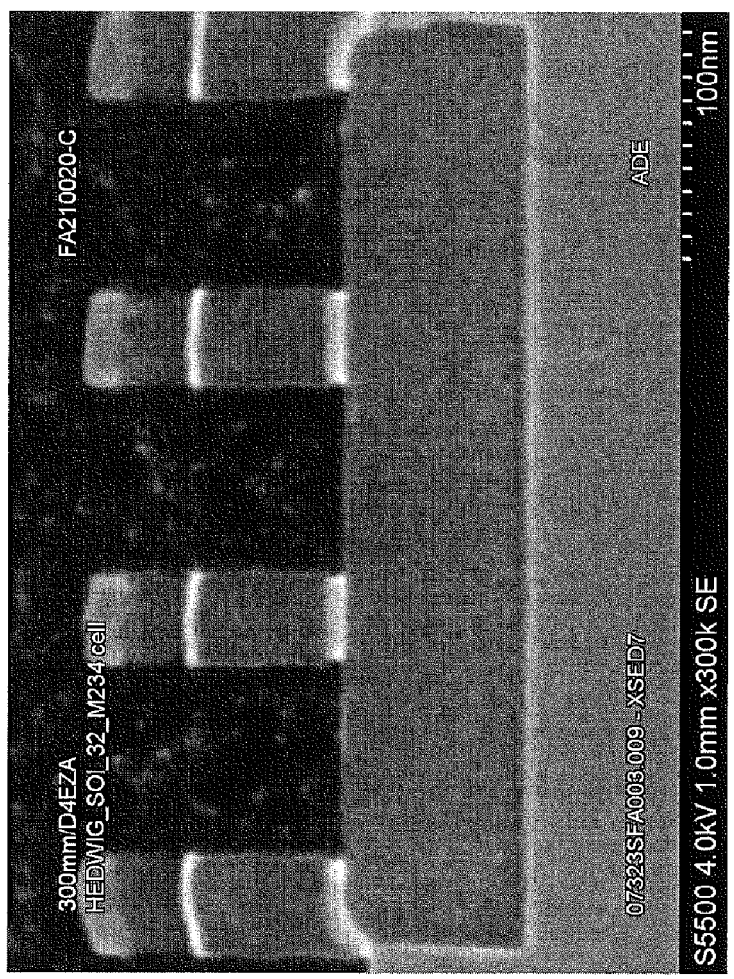
FIG. 2 is a scanning electron microscopy (SEM) image of a semiconductor device structure with HKMG stacks such as shown in FIGS. 1(a) and 1(b)

In the formation of FET gate devices, insulating spacers 116 are formed on sidewalls of the gate stacks, as shown in FIG. 1(b). Where a step height, x, between a recessed STI region 104 and active area substrate 102 exceeds a thickness, z, of the metal layer 110 in the HKMG stack, the result may be an asymmetric extrusion of the metal foot 114 by a width, y. If this dimension y is great enough so as to equal or exceed a thickness, δ, of the sidewall spacer 116, then at least a portion of the metal foot 114 will be left unprotected by the sidewall spacer 116. As a result, the gate metal is vulnerable to wet etch chemistries during subsequent processing steps, which in turn may result in gate liftoff. By way of further illustration, FIG. 2 is a scanning electron microscopy (SEM) image of a semiconductor device structure with HKMG stacks such as shown in FIGS. 1(a) and 1(b). In particular, it will be seen that the outermost gate stacks partially extend down into a recess between the active area the adjacent STI region.

A similar issue may exist in the case of a so-called dummy gate stack formed over the STI region, but very close to the active area region. For example, FIG. 3(a) is a cross-sectional view of a semiconductor device structure 300 with HKMG stacks where a dummy gate stack 306 formed on an STI region adjacent an active area is formed with excess metal thickness at the STI/active area border. This excess metal thickness results from both the step height between the active area 102 and STI region 104, and the proximity of the gate stack 306 to the active area 102.

Figure 4:
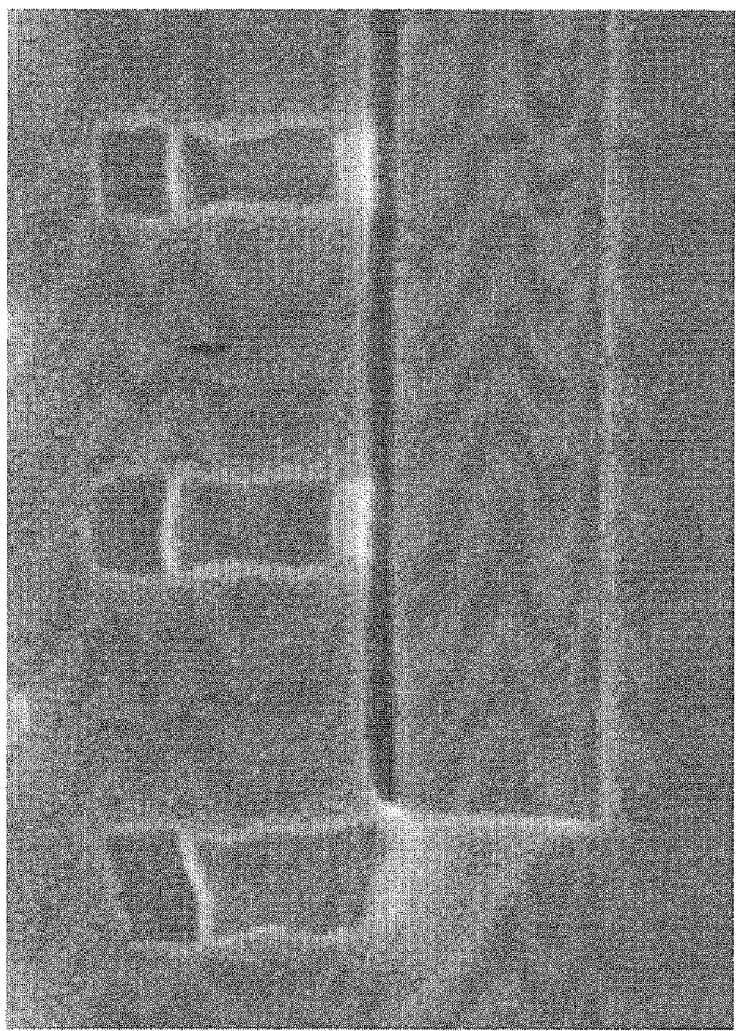
FIG. 4 is an SEM image of a semiconductor device structure with HKMG stacks such as shown in FIGS. 1(a) and 1(b)

As shown in FIG. 3(b), the formation of the sidewall spacers 116 does not completely protect the gate metal 110 from subsequent processing, as shown at region 308. By way of further illustration, FIG. 4 is SEM image of a semiconductor device structure with HKMG stacks such as shown in FIGS. 1(a) and 1(b). In particular, it will be seen that the outermost gate stacks partially extend down into a recess between the active area the adjacent STI region.

Figure 5:
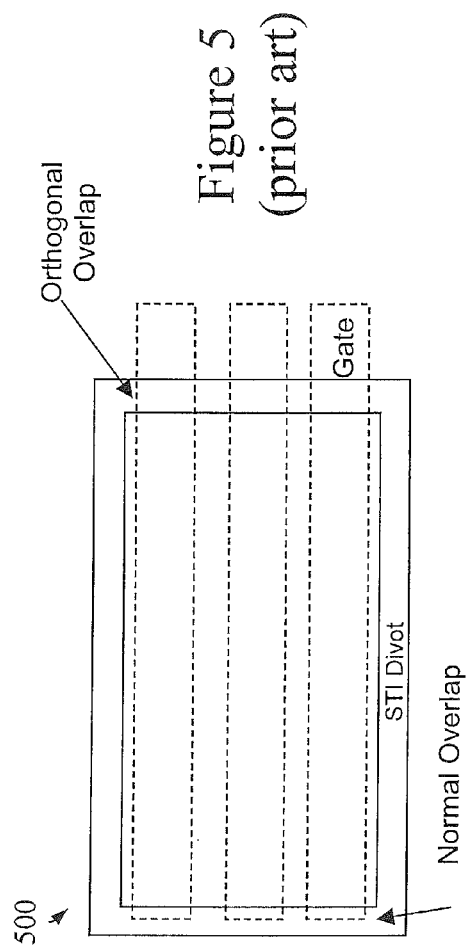
FIG. 5 is a top view of a semiconductor device structure illustrating metal divot formation due to overlap of a gate structure with an STI divot.
Figure 6:
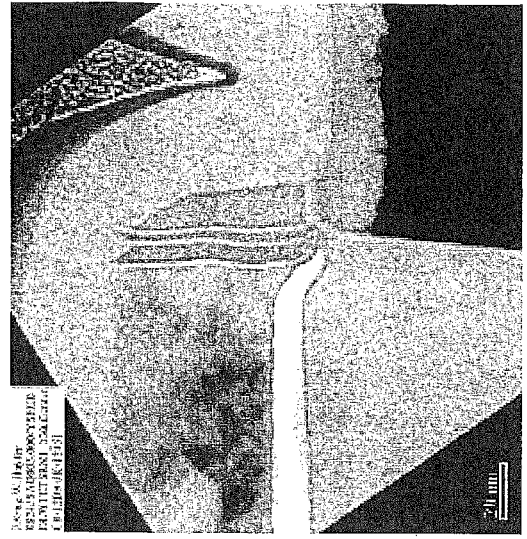
FIG. 6 is an SEM image of a semiconductor device structure with a metal divot protrusion such as shown in FIG. 5.

Still another example of the effects of STI divoting on metal gate structures is shown in FIG. 5, which is a top view of a semiconductor device structure 500 illustrating metal divot formation due to overlap of a gate structure with an STI divot. Specifically, the dashed lines in FIG. 5 represent gate structures that overlap a (rectangular) STI divot region. On the left portion of FIG. 5, the gate structures slightly overlap the STI divot. However, on the right portion of FIG. 5, the gate structures extend and overlap the STI divot orthogonally, which again leads to the spacer material floating above protruding gate metal and failing to encapsulate the metal gate. FIG. 6 is an SEM image of a semiconductor device structure with a metal divot protrusion such as shown in FIG. 5.

Figure 7C:
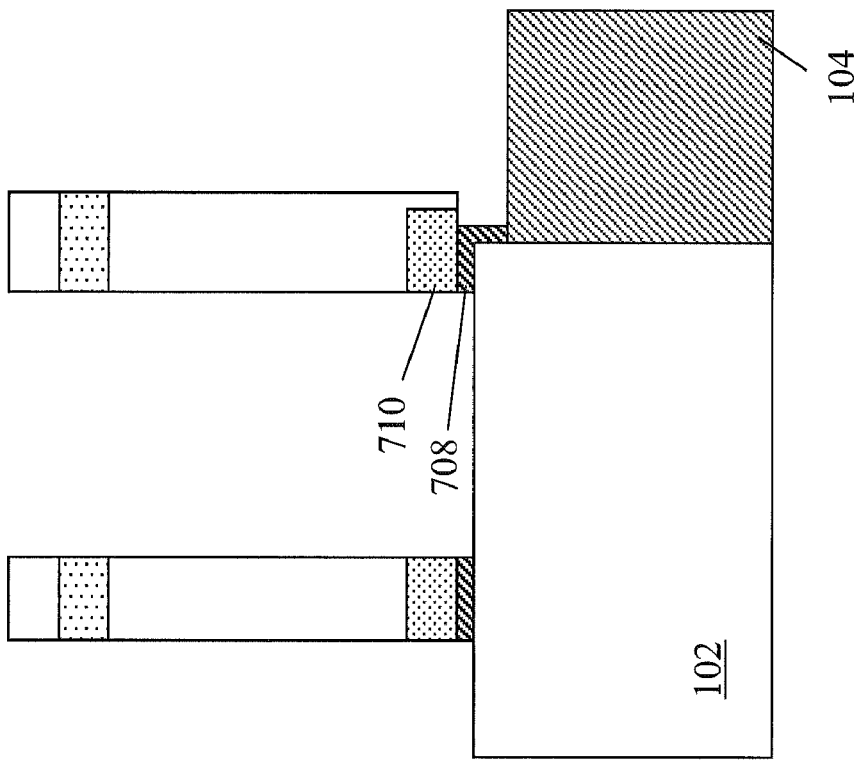

Accordingly, FIGS. 7(a) through 7(e) are a sequence of cross-sectional views illustrating an exemplary embodiment of a method of protecting exposed metal gate structures from etching processes during integrated circuit manufacturing. In particular, FIG. 7(a) illustrates a semiconductor device structure 700 with HKMG stacks where an active area gate stack 706 formed adjacent an STI region partially extends over to the STI region 704, leading to formation of a metal foot 714 on the STI region 704. In FIG. 7(b), the formation of a first set of spacers 716 on the gate sidewalls fails to completely encapsulate the metal foot 714.

Then, as shown in FIG. 7(c), an isotropic etch is performed to remove the metal foot portion of the gate stack metal layer, while still preserving the planar portion of the metal layer 710 formed atop the high-K gate dielectric layer 708. Suitable isotropic etch conditions may include, for example, an inductive plasma etch operating at about 5 milliTorr (mT) to about 30 mT, with an etch chemistry comprising about 20%-70% by volume $BCl_3$, about 0-20% by volume $Cl_2$, with the balance thereof being Ar, and at wafer temperature of about 100° C. to about 400° C. In a more specific embodiment, isotropic etch conditions may include, for example, an inductive plasma etch operating at about 5-10 mT, with an etch chemistry comprising about 40%-60% by volume $BCl_3$, about 5%-10% by volume $Cl_2$, with the balance thereof being Ar, and at wafer temperature of about 180° C. to about 280° C. By performing an isotropic etch of the metal, the bottom of the spacer layer 716 that was initially formed atop the foot is undercut.

Figure 7D:
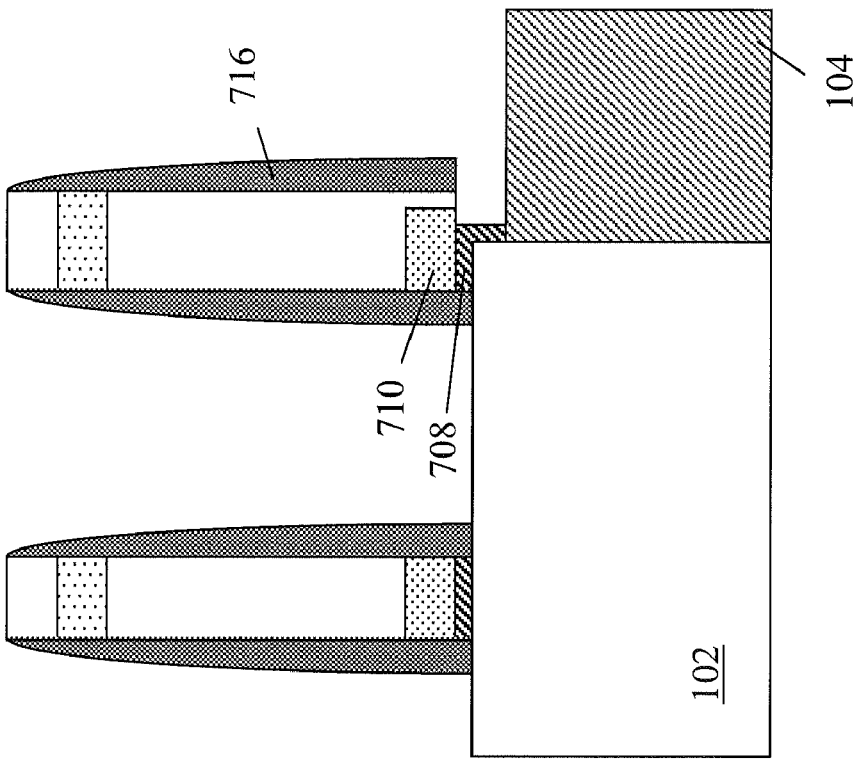
Figure 7E:
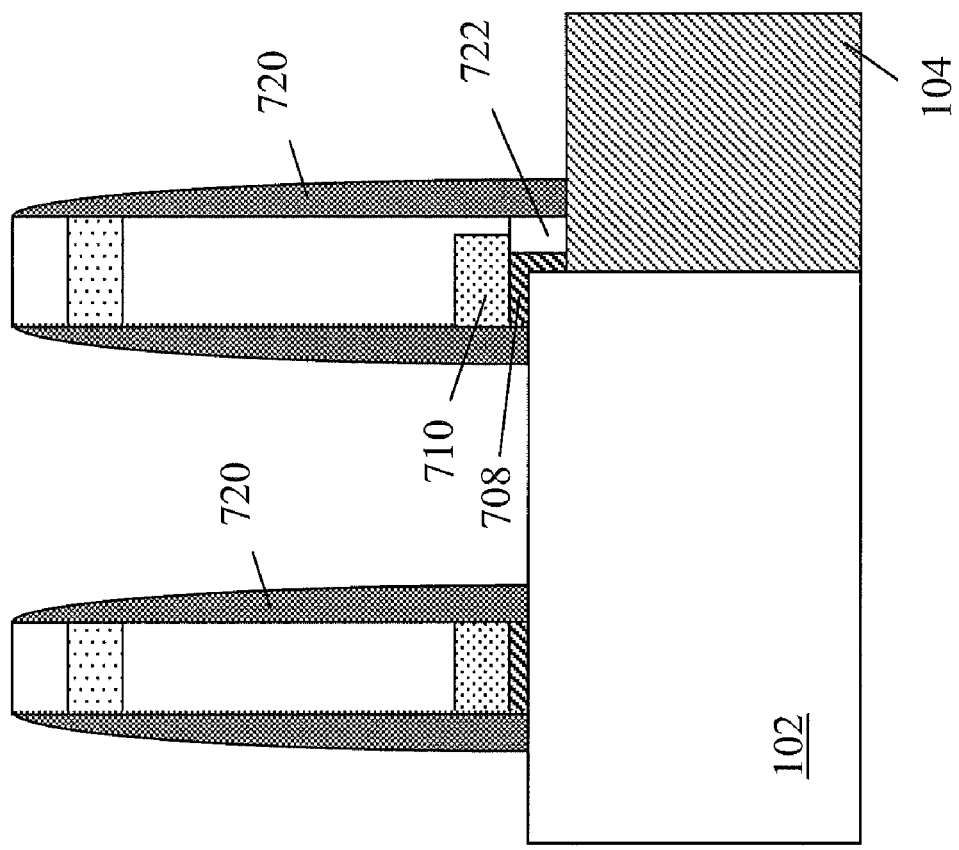

In the embodiment depicted, the first set of spacers 716 comprises sacrificial spacers, in that they are removed following the isotropic etch, as shown in FIG. 7(d). However, in other embodiments, the first set of spacers may remain. As then shown in FIG. 7(e), a second set of spacers 720 is formed in a manner similar to the first set of spacers. Here, however, the second set of spacers completely covers the exposed gate metal due to the isotropic etching. A small void 722 may be formed as a result, but since the spacer material extends all the way to the top of the STI region 704, the gate stack metal is encapsulated. Processing in accordance with known techniques may proceed thereafter.

Figure 8B:
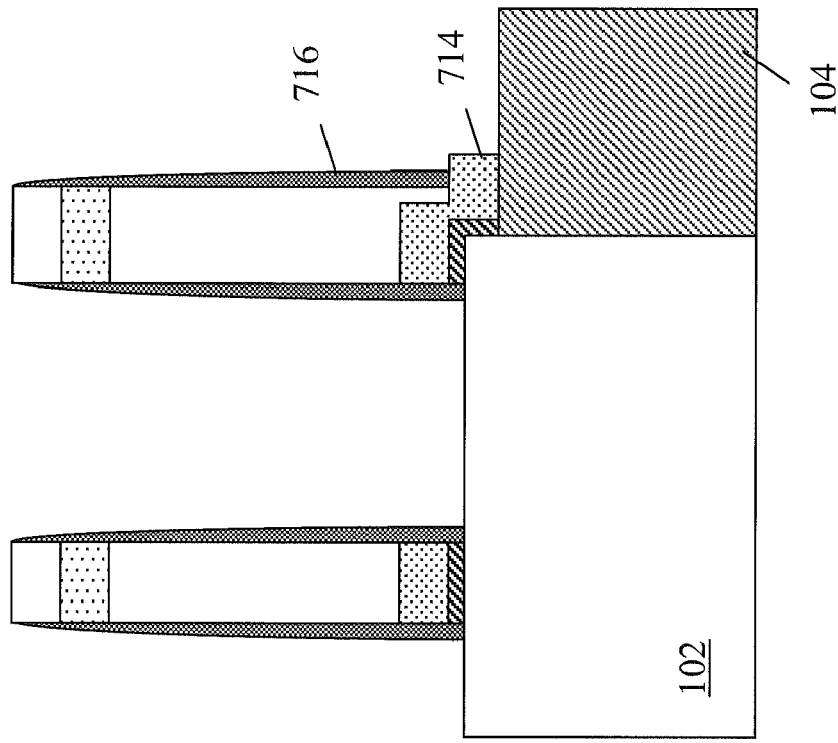
Figure 8A:
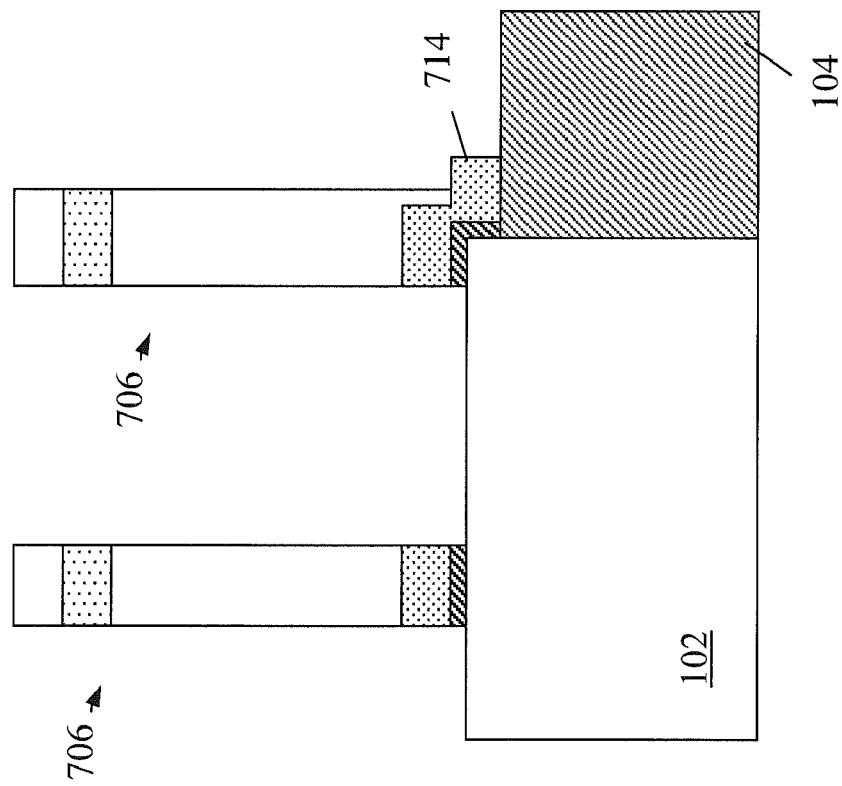
Figure 8C:
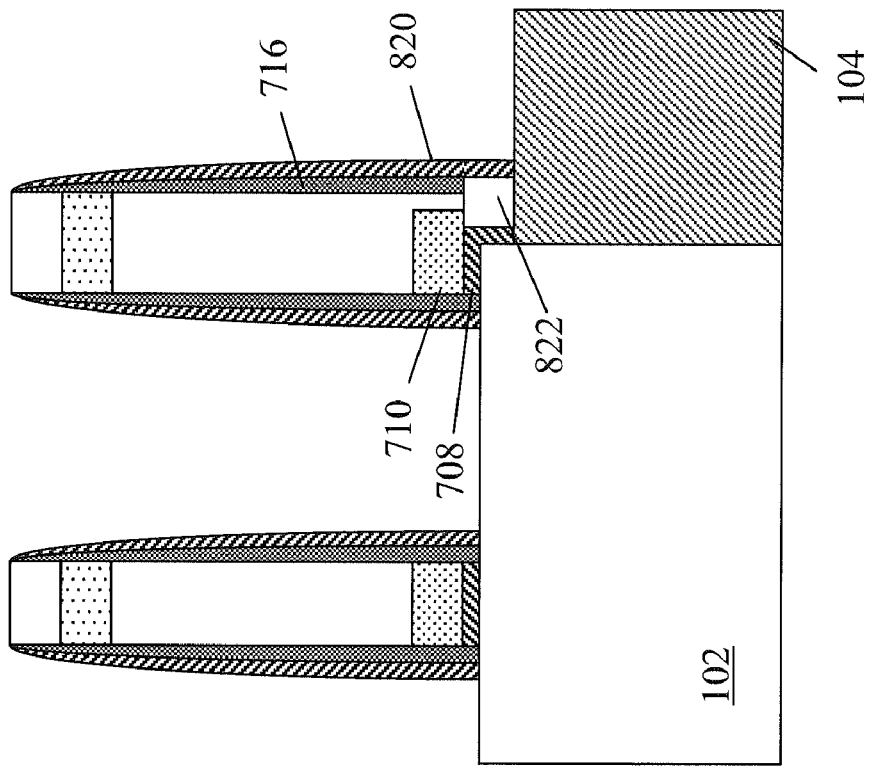
Figure 8D:
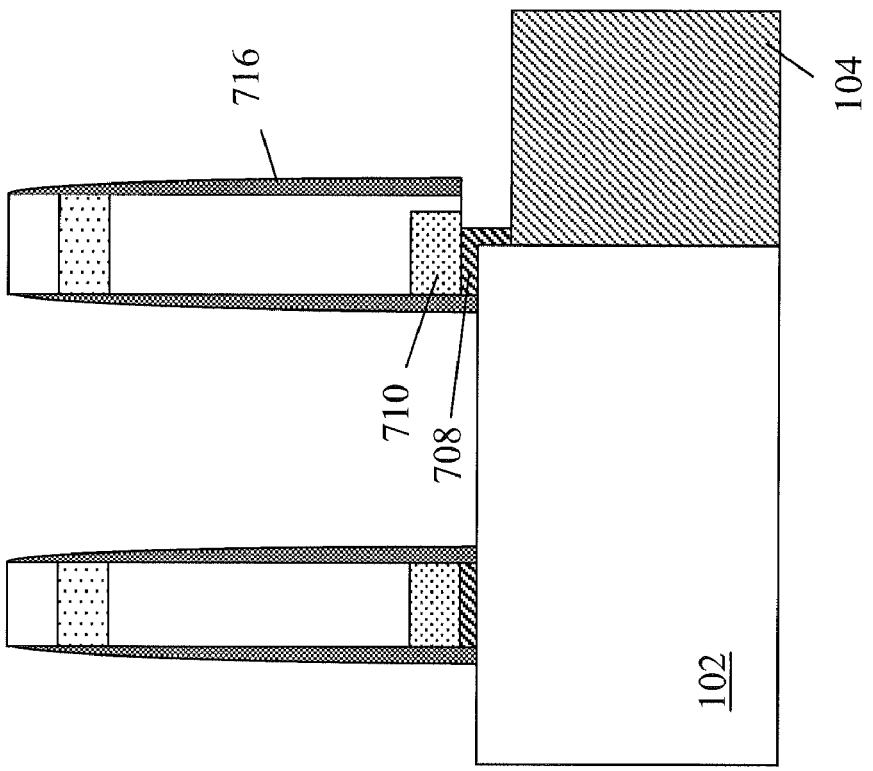

As stated above, the first set of spacers may remain upon the gate stack following the isotropic etch of the metal protrusion. This variation is depicted in the alternative embodiment of FIGS. 8(a) through 8(d). In this embodiment, the processing of FIGS. 8(a) through 8(c) is the same as in FIGS. 7(a) through 7(c). Instead of removing the first set of spacers 716 following the isotropic etch of the metal protrusion/foot, the spacers 716 remain on the gate stacks, followed by formation of a second set of spacers 820, as shown in FIG. 8(d). Since the second set of spacers 820 extends all the way to the top of the STI region 104, the gate metal is completely encapsulated for further device processing, with a small void 822 possibly resulting.

Finally, FIGS. 9(a) through 9(d) are a sequence of cross-sectional views illustrating a method of protecting exposed metal gate structures from etching processes during integrated circuit manufacturing, in accordance with another exemplary embodiment. In this example, FIG. 9(a) illustrates a semiconductor device structure 900 with HKMG stacks where a dummy gate 906 formed on an STI region 904 adjacent an active area 902 is formed with excess metal thickness at the STI/active area border. In FIG. 9(b), a first set of spacers 916 is formed over the HKMG stacks of FIG. 9(a). As can be seen, the width of the spacers 916 is insufficient to completely encapsulate the excess metal 910 between the gate stack 906 and the active area step height.

As shown in FIG. 9(c), both the excess metal 910 and high-K gate dielectric 908 are isotropically etched, vertically and horizontally, so as to undercut the short side spacer 916. Thus, upon formation of a second set of spacers 920 in FIG. 9(d), the metal gate material 910 is completely encapsulated.

As will thus be appreciated, through the use of an isotropic metal etch following a first spacer formation, a subsequently formed second set of spacers is able to completely protect an HKMG stack from middle-of-line (MOL) wet etch processes. This avoids the need, for example, to overetch the metal during the initial gate stack formation and unnecessarily undercutting the device gates.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of forming a semiconductor device, the method comprising:
    forming a transistor gate stack over a substrate having an active area and a shallow trench isolation (STI) region;
    forming first sidewall spacers on the transistor gate stack;
    applying an isotropic etch process to isotropically remove an excess portion of a metal layer included within the transistor gate stack, the excess portion left unprotected by the first sidewall spacers; and
    forming second sidewall spacers on the transistor gate stack, the second sidewall spacers completely encapsulating the metal layer of the transistor gate stack.

2. The method of claim 1, further comprising removing the first sidewall spacers following the isotropic etch process, prior to forming the second sidewall spacers.

3. The method of claim 1, wherein the second sidewall spacers are formed over the first sidewall spacers.

4. The method of claim 1, wherein the transistor gate is in proximity to a junction between the active area region and the STI region, the junction having a step height difference that results in the excess portion of the metal layer being left unprotected by the first sidewall spacers.

5. The method of claim 4, wherein the transistor gate is an active area gate that partially extends over the STI region, and the excess portion of the metal layer comprises a foot formed atop the STI region.

6. The method of claim 5, wherein the foot extends a distance along the STI region that is greater than or equal to a thickness of the first spacers.

7. The method of claim 4, wherein the transistor gate is a dummy gate formed over the STI region in proximity to the active area and the excess portion of the metal layer is disposed between the dummy gate and the active area.

8. The method of claim 7, further comprising isotropically etching a portion of a high-K gate dielectric layer included within the transistor gate stack.

9. The method of claim 1, wherein the isotropic etch process comprises an inductive plasma etch operating at about 5 milliTorr (mT) to about 30 mT, with an etch chemistry comprising about 20%-70% by volume $BCl_3$, about 0-20% by volume $Cl_2$, with the balance thereof being Ar, and at wafer temperature of about 100° C. to about 400° C.

10. The method of claim 1, wherein the isotropic etch process comprises an inductive plasma etch operating at about 5-10 mT, with an etch chemistry comprising about 40%-60% by volume $BCl_3$, about 5%-10% by volume $Cl_2$, with the balance thereof being Ar, and at wafer temperature of about 180° C. to about 280° C.

11. A method of forming a transistor device, the method comprising:

forming a transistor gate stack over a substrate having an active area and a shallow trench isolation (STI) region, the transistor gate stack comprising a high-K dielectric layer, a metal layer over the high-K dielectric layer, and a polysilicon layer over the metal gate layer;

forming first sidewall spacers on the transistor gate stack;

applying an isotropic etch process to isotropically remove an excess portion of the metal layer gate, the excess portion left unprotected by the first sidewall spacers; and forming second sidewall spacers on the transistor gate stack, the second sidewall spacers completely encapsulating the metal layer of the transistor gate stack.

12. The method of claim 11, further comprising removing the first sidewall spacers following the isotropic etch process, prior to forming the second sidewall spacers.

13. The method of claim 11, wherein the second sidewall spacers are formed over the first sidewall spacers.

14. The method of claim 11, wherein the transistor gate is in proximity to a junction between the active area region and the STI region, the junction having a step height difference that results in the excess portion of the metal layer being left unprotected by the first sidewall spacers.

15. The method of claim 14, wherein the transistor gate is an active area gate that partially extends over the STI region, and the excess portion of the metal layer comprises a foot formed atop the STI region.

16. The method of claim 15, wherein the foot extends a distance along the STI region that is greater than or equal to a thickness of the first spacers.

17. The method of claim 14, wherein the transistor gate is a dummy gate formed over the STI region in proximity to the active area and the excess portion of the metal layer is disposed between the dummy gate and the active area.

18. The method of claim 17, further comprising isotropically etching a portion of a high-K gate dielectric layer included within the transistor gate stack.

19. The method of claim 11, wherein the isotropic etch process comprises an inductive plasma etch operating at about 5 milliTorr (mT) to about 30 mT, with an etch chemistry comprising about 20%-70% by volume $BCl_3$, about 0-20% by volume $Cl_2$, with the balance thereof being Ar, and at wafer temperature of about 100° C. to about 400° C.

20. The method of claim 11, wherein the isotropic etch process comprises an inductive plasma etch operating at about 5-10 mT, with an etch chemistry comprising about 40%-60% by volume $BCl_3$, about 5%-10% by volume $Cl_2$, with the balance thereof being Ar, and at wafer temperature of about 180° C. to about 280° C.

* * * * *